United States Patent
Imai et al.

(10) Patent No.: US 6,699,646 B2
(45) Date of Patent: Mar. 2, 2004

(54) POSITIVE TYPE PHOTOSENSITIVE RESIN COMPOSITION AND METHOD FOR FORMING RESIST PATTERN

(76) Inventors: Genji Imai, 438-7, Shindo, Hiratsuka-shi, Kanagawa (JP); Hideo Kogure, 1-11-2-246, Tsumadahigashi, Atsugi-shi, Kanagawa (JP)

( * ) Notice: Subject to any disclaimer, the term of this patent is extended or adjusted under 35 U.S.C. 154(b) by 21 days.

(21) Appl. No.: 09/996,085

(22) Filed: Sep. 13, 2001

(65) Prior Publication Data

US 2002/0094488 A1 Jul. 18, 2002

Related U.S. Application Data

(63) Continuation of application No. 09/193,688, filed on Nov. 18, 1998, now abandoned.

(30) Foreign Application Priority Data

Nov. 28, 1997 (JP) ............................................. 9-327870
May 29, 1998 (JP) ........................................... 10-148892

(51) Int. Cl.[7] .......................... G03F 7/039; G03F 7/20; G03F 7/30; G03C 1/74; G03C 5/56
(52) U.S. Cl. .................... 430/326; 430/270.1; 430/945; 430/331
(58) Field of Search ............................ 430/270.1, 326, 430/331, 914, 945

(56) References Cited

U.S. PATENT DOCUMENTS

| | | | | |
|---|---|---|---|---|
| 4,029,983 A | * | 6/1977 | Thornton ...................... | 313/25 |
| 4,296,194 A | * | 10/1981 | Harper et al. ................ | 430/176 |
| 4,407,984 A | * | 10/1983 | Ratcliffe et al. .............. | 522/14 |
| 4,827,176 A | * | 5/1989 | Inukai et al. .................. | 313/54 |
| 5,153,482 A | * | 10/1992 | Keijser et al. ............... | 313/634 |

* cited by examiner

*Primary Examiner*—Janet Baxter
*Assistant Examiner*—Sin J. Lee

(57) ABSTRACT

A liquid or a solid positive type photosensitive resin composition is herein disclosed which is used under the irradiation circumstance of a safelight having a maximum wavelength within the range of 500 to 620 nm, wherein an absorbancy of an unexposed film formed from this composition is 0.5 or less within the range of the maximum wavelength ±30 nm selected from the range of the maximum wavelength of the safelight; and a method for forming a resist pattern is also disclosed which comprises (1) a step of applying a positive type photosensitive resin composition onto a substrate to form a photosensitive film thereon, (2) a step of exposing the photosensitive film so as to obtain a desired pattern, and (3) a step of performing a developing treatment to form a resist pattern, wherein at least one step of the steps (1) to (3) is carried out under the irradiation circumstance of the safelight having a high spectral luminous efficiency in which the maximum wavelength of an emission spectrum of a light source is within the range of 500 to 620 nm.

1 Claim, 3 Drawing Sheets

POSITIVE TYPE PHOTOSENSITIVE RESIN COMPOSITION AND METHOD FOR FORMING RESIST PATTERN

This application is a continuation of application Ser. No. 09/193,688, filed on Nov. 18, 1998, now abandoned.

BACKGROUND OF THE INVENTION

1. Field of the Invention

The present invention relates to a novel positive type photosensitive resin composition and a method for forming a resist pattern.

2. Description of the Related Art

A positive type photosensitive resin composition has excellent characteristics in points of no environmental pollution, the saving of resources and energy, high production efficiency and the like, and for this reason, the composition has heretofore been used as a coating composition, an ink and an adhesive in many fields. This kind of photosensitive resin composition has been applied to use purposes in which circuit boards, plastics, lumbers, metals, papers, glasses, fibers and the like are used as materials.

However, when-such a positive type photosensitive resin composition is industrially produced and applied to a practical line, the following problems are present.

The positive type photosensitive resin composition intends to utilize a difference of solubility between an exposed portion and an unexposed portion.

With regard to an emission spectrum wavelength of a visible light which has heretofore been used for the exposure, for example, activated lights of 488 nm, 532 nm and the like have been usually used. In the case that such a photosensitive resin composition is handled, an electric lamp such as a fluorescent lamp colored by coating an outer tube thereof with a dark red colorant or by winding a dark red film around the outer tube is used as a safelight (a working lamp). Under the surroundings of such a dark red safelight, however, some problems are present. For example, it is difficult to inspect the state of a coating film after the coating, and it is not easy to check a coating apparatus, an irradiation apparatus, a conveying apparatus and the like. In consequence, safe working properties, a working efficiency, the quality stability of products and the like are poor.

SUMMARY OF THE INVENTION

The present invention has been developed for the purpose of developing a novel positive type photosensitive resin composition which can be handled under conditions of a bright safelight, and a method for forming a resist pattern by the use of this composition.

The present inventors have intensively researched with the intention of solving the above problems, and as a result, it has been found that combining a specific positive type photosensitive resin composition and a specific safelight can solve the conventional problems. In consequence, the present invention has been completed.

That is to say, the aspects of the present invention are as follows:

1. A liquid or a solid positive type photosensitive resin composition which is used under the irradiation circumstance of a safelight having a maximum wavelength within the range of 500 to 620 nm, wherein an absorbancy of an unexposed film formed from this composition is 0.5 or less within the range of the maximum wavelength ±30 nm selected from the range of the maximum wavelength of the safelight.

2. The above-mentioned positive type photosensitive resin composition which comprises a resin and a light acid generator for generating an acid radical by an active energy ray as essential components, the resin and the light acid generator being chemically bonded, or the resin and the light acid generator being mixed.

3. The above-mentioned positive type photosensitive resin composition wherein the safelight is given from a discharge lamp containing sodium as a main component (which consists mainly of a D-ray having a light wavelength of 589 nm).

4. A method for forming a resist pattern which comprises:
   (1) a step of applying a positive type photosensitive resin composition onto a substrate to form a photosensitive film thereon,
   (2) a step of exposing the photosensitive film formed on the substrate to a laser beam directly or through a mask film so that a desired resist pattern (an image) may be obtained on the photosensitive film, and
   (3) a step of subjecting the resist film to a developing treatment to form the resist pattern on the substrate, wherein an absorbancy of an unexposed film formed from the positive type photosensitive resin composition is 0.5 or less within the range of a maximum wavelength ±30 nm selected in the range of the maximum wavelength of a safelight; and at least one step of the steps (1) to (3) is carried out under the irradiation circumstance of the safelight having a high spectral luminous efficiency in which the maximum wavelength of an emission spectrum of a light source is within the range of 500 to 620 nm.

5. The method for forming the resist pattern wherein the safelight is given from a discharge lamp containing sodium as a main component (which consists mainly of a D-ray having a light wavelength of 589 nm).

According to the present invention, it is possible to form a resist pattern which is remarkably excellent in safe operativity, operational efficiency, the quality stability of products, and the like.

DETAILED DESCRIPTION OF THE PREFERRED EMBODIMENTS

Figure 5:
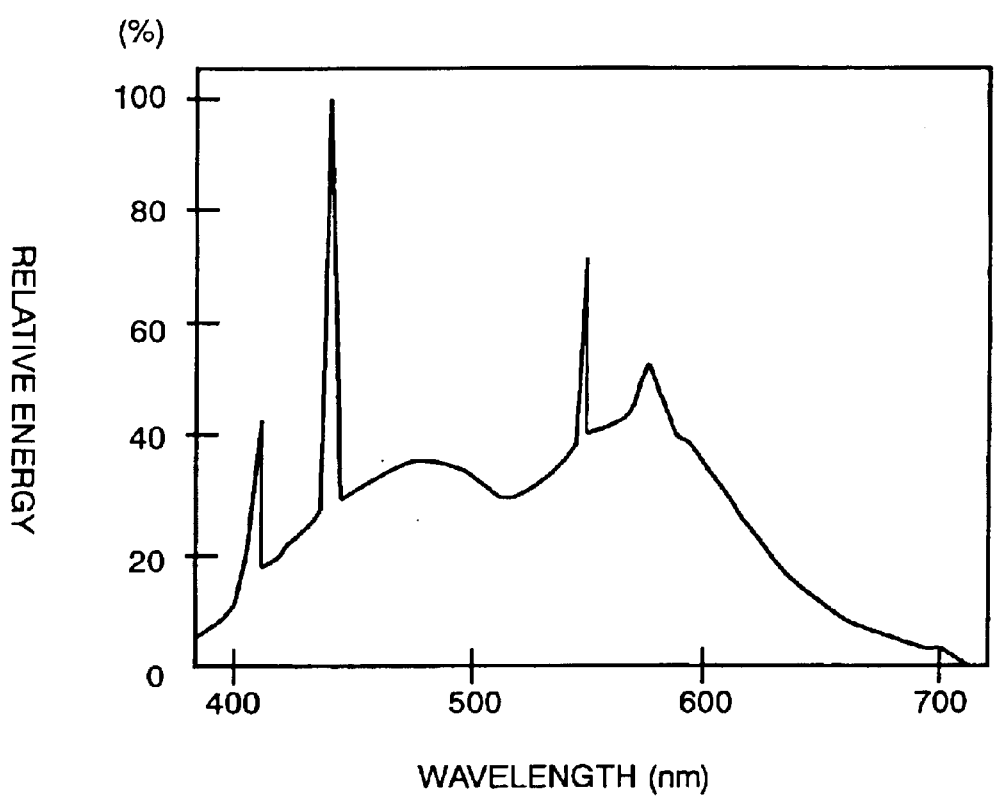
FIG. 5 is a graph showing a spectral distribution of a fluorescent lamp.

In the present invention, a light having a maximum wavelength in the range of 500 to 620 nm is a safelight which does not bring about a radical polymerization reaction of a specific positive type photosensitive resin composition, and the safelight in this range has a high spectral luminous efficiency to workers. Accordingly, at the same illumination light intensity, this safelight seems to be much brighter as compared with a safelight for use in a conventional method. The present invention utilizes the characteristics of the above-mentioned safelight, whereby safe operativity, operational efficiency, the quality stability of products, and the like can be improved. Furthermore, as the safelight for use in the conventional method, a fluorescent lamp which is colored red has been used, but an emission spectrum of the fluorescent lamp has a wavelength range within a wide range of from an ultraviolet light to a visible light region (FIG. 5). Therefore, this fluorescent lamp exposes even a portion of the photosensitive resin coating film which does not need to be sensitized, so that no clear resist pattern can be formed by a developing treatment. Lowering the intensity of the light, which inconveniently makes a working circumstance dark, compensates this drawback. On the contrary, in the present invention, there is employed the safelight, for example, a sodium lamp having a sharp wavelength, whereby the above-mentioned problem can be solved.

Figure 1:
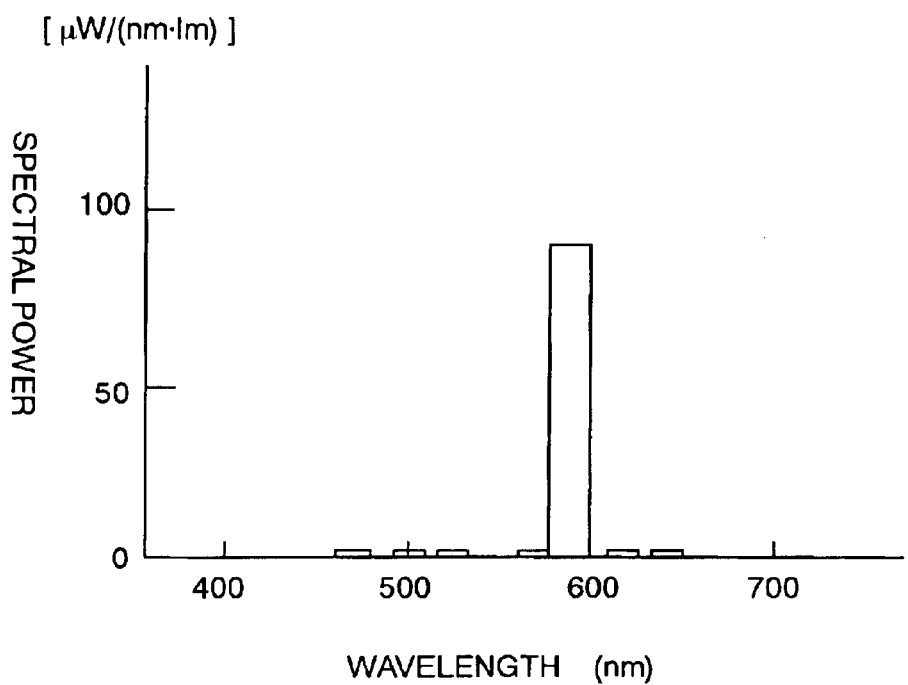
FIG. 1 is a graph showing one example of a spectral distribution of a discharge lamp for a safelight containing sodium as a main component which can be used in the present invention.

The safelight for use in the present invention has a maximum wavelength within the range of 500 to 620 nm, preferably 510 to 600 nm. This safelight can be obtained, for example, by using a discharge lamp in which the light having the maximum wavelength in the above-mentioned range of 500 to 620 nm can be emitted by discharging the lamp itself in a gas such as sodium. Of various discharge lamps, the sodium lamp is excellent in safety properties, working circumstance properties and the like, because the light emitted from the sodium lamp consists mainly of a yellow D-ray having a wavelength of 589 nm and it is a monochromatic light, so that a chromatic aberration of the light is low and hence objects can be sharply displayed. FIG. 1 shows a spectrally distributed wavelength of the low-pressure sodium lamp.

As shown in FIG. 1 regarding this spectral distribution diagram of the sodium lamp, in addition to the D-ray having the maximum wavelength of the sodium lamp, the safelight may have a high-energy ray (a short-wavelength range) to such a degree as not to adversely affect the photosensitive resin composition.

Figure 2:
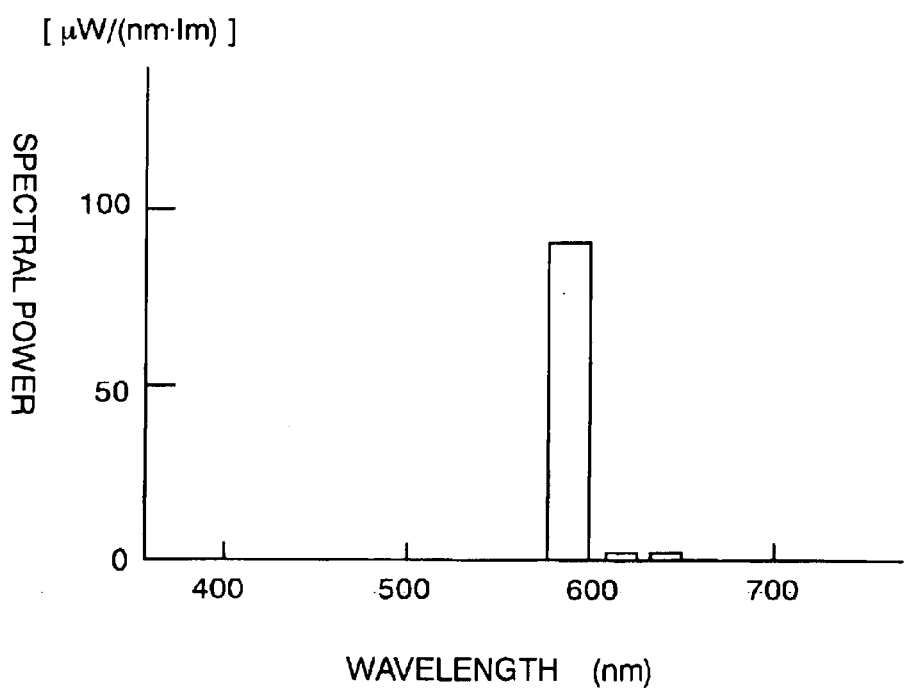
FIG. 2 is a graph showing a spectral distribution of the sodium discharge lamp to which a filter is attached.

Furthermore, a light emitted from the sodium lamp equipped with a filter to cut the high-energy ray other than the D-ray can also be used as the safelight. The spectral distribution of the sodium lamp in which the high-energy ray is cut is shown in FIG. 2. Examples of the filter include "Fantac FD-1081 Scarlet", "Fantac FC-1431 Sunflower Yellow" (both of them are trade marks and made by Kansai Paint Co., Ltd.), and "Lintech Lumicool film No. 1905" (a trade mark, made by Lintech Co., Ltd.).

In addition, the safelight for use in the present invention is preferably a sharp monochromatic light of 589 nm such as the light from the sodium lamp, but in addition to the light having the maximum wavelength in the range of 500 to 620 nm, there may be used a safelight having a wavelength which is distributed in a wavelength range of an ultraviolet light, a visible light or an infrared light. However, when the safelight having such a distribution outside the above-mentioned range is used, this distributed light range is required to be the range of the safelight which does not have an adverse influence (sensitization) on the positive type photosensitive resin composition.

Such a safe high-energy light range is concerned with the distributed energy intensity of the light and the absorbancy of the positive type photosensitive resin composition in this range. When the energy intensity of the light is high, the composition having the low absorbency can be used, and when the energy intensity of the light is low, the composition having a relatively higher absorbency than the former can be used. However, a usual fluorescent lamp having a maximum wavelength in the range of 500 to 620 nm cannot be used as the safelight for the positive type photosensitive resin composition which is to be sensitized by the visible laser having an oscillation line especially at 488 nm or 532 nm, because this type of fluorescent lamp has the high light energy in less than 500 nm, especially in 400 to 499 nm.

The absorbency defined in the present invention is represented by the formula of $-\log (I/I_0)$ wherein I is an intensity of the light transmitted through a coating film formed by applying the visible light curable resin composition onto the surface of a transparent substrate and then drying the same (removing the solvent); and $I_0$ is an intensity of the light transmitted through a blank {the transparent substrate (e.g., a polyethylene terephthalate sheet) onto which the sample (the positive type photosensitive resin composition) is applied}.

Figure 3:
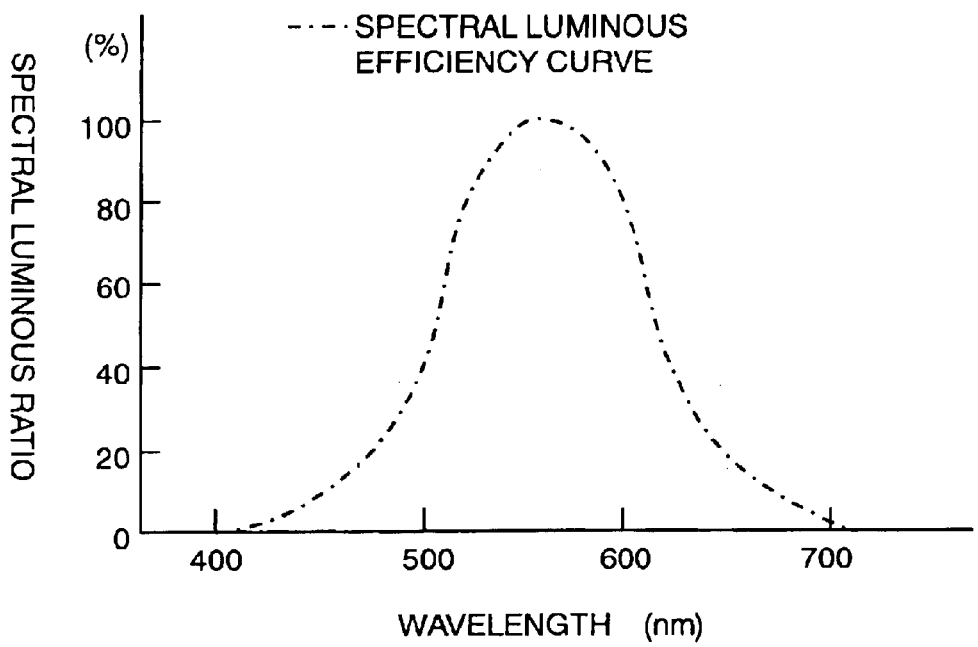
FIG. 3 is a graph showing a spectral luminous efficiency curve.

An extent of a light brightness which human eyes can perceive can be represented by the spectral luminous efficiency. As defined in JIS Z8113-2005, this spectral luminous efficiency can be defined as the reciprocal of a relative value of a radiation luminance of a monochromatic light having a wavelength $\lambda$ when the brightness of the monochromatic light having the wavelength $\lambda$ is judged to be equal to that of a reference for comparison under predetermined observational conditions, and usually, it can be defined as a value standardized so that the maximum value may become 1 when the wavelength $\lambda$ is varied. FIG. 3 shows a spectral luminous efficiency curve in the range of 380 to 780 nm that is the wavelength range of the visible light. In FIG. 3, the ratio of the spectral luminous efficiency is shown on the assumption that the maximum value of the spectral luminous efficiency on the ordinate axis is 100. It is apparent from this curve that in the range of 640 to 780 nm which is the conventional wavelength range of red, the spectral luminous efficiency is low and this range is perceived to be dark by human eyes, and for example, in order for the human eyes to perceive the same brightness as at a wavelength of 589 nm, the intensity of the irradiated light must be further increased. In addition, the maximum value of a luminosity is about 555 nm (JIS-Z8113 2008).

The positive type photosensitive resin composition for use in the present invention is a composition designed so that portions exposed to an active energy ray may be only dissolved in and removed by a developing solution, and a conventionally known composition can be used, so long as an absorbency of an unexposed film formed from this composition is 0.5 or less, preferably 0.2 or less, more preferably 0.1 or less within the range of the central wavelength ±30 nm (−30 nm to +30 nm), preferably the maximum wavelength ±20 nm (−20 nm to +20 nm), or more preferably the maximum wavelength ±10 nm (−10 nm to +10 nm) of the maximum wavelength selected from the above-mentioned range of the maximum wavelength of the safelight. As this kind of composition, there can be used any of compositions which are used in, for example, coating compositions, inks, adhesives, printing plate materials and resist materials for printed-wiring boards.

Typical examples of the above-mentioned conventional known positive type photosensitive resin composition will be described.

Examples of the composition include a resin including a light acid generator, a resin including components (e.g., a light base generator and the like) other than the light acid generator, and a resin which decomposes itself by a light. Each of these resins can decompose by the light, so that characteristics such as the polarity and the molecular weight of the resin itself can change, whereby it can be dissolved in a substance such as a developing solution (e.g., an aqueous developing solution or an organic solvent). The resin may be incorporated with a component such as the light acid generator or may be a mixture of a component such as the light acid generator and a resin having a group capable of decompostion by an acid or the like. If necessary, the resin can be further blended with another resin for regulating its solubility in the developing solution.

The above-mentioned resin including the light acid generator component will be described. Examples of the resin include a resin in which the light acid generator is incorporated into a resin skeleton (e.g., a resin which generates an acid group by exposure to make an alkaline development possible) and a mixture of the light acid generator and a resin {a mixture in which the resin is cleaved into low-molecular weight moieties with an acid generated from the light acid generator, and an acid group is imparted to the resin to change into a soluble substance, e.g., poly(p-hydroxystyrene), whereby the resin is dispersible or soluble in an organic solvent or an aqueous developing solution}.

Typical examples of the resin including the light acid generator include (1) a composition including, as a main component, a resin in which a quinonediazidosulfonic acid is combined with a base resin such as an acrylic resin having an ion formation group via a sulfonic acid ester bond (refer to Japanese Patent Application Laid-Open Nos. 206293/1986 and 133449/1995), i.e., a naphthoquinonediazido photosensitive composition utilizing a reaction in which a quinonediazido group decomposes by the irradiation of the light to form indenecarboxylic acid via ketene;

(2) a chemical amplification system photosensitive material utilizing a change of solubility between an exposed portion and an unexposed portion by bringing about an elimination reaction of a base resin (a polymer) in a change state in the presence of the light acid generator for generating the acid group with the irradiation of the light as a catalyst {refer to Japanese Patent Application Laid-Open Nos. 226461/1992, 45439/1984 and 250842/1988; U.S. Pat. No. 4,491,628; "Polymers in Electronics", edited by Davidson T., ACS Symposium Series 242, American Chemical Society, Washington D.C., p. 11 (1984); N. Hayashi, T. Ueno, M. Toriumi, etc, ACS Polym. Materials Sci. Eng., Vol. 61, p. 417 (1989); and H. Ito, C. G. Wilson, ACS Symp., Ser. 242, p. 11 (1984)}; and (3) a positive type photosensitive composition utilizing a mechanism in which a crosslinked film insoluble in a solvent or an aqueous alkali solution is formed by heating, and a crosslinking structure is then cut with the light acid generator for generating the acid group by the irradiation of the light, so that irradiated portions become soluble in the solvent or the aqueous alkali solution. (refer to Japanese Patent Application Laid-Open Nos. 295064/1994, 308733/1994, 313134/1994, 313135/1994, 313136/1994 and 146552/1995).

In the above-mentioned composition (2), a functional group (a hydroxyl group, a carboxyl group or the like) which controls the solubility of the resin in the developing solution is blocked (with an acid-to-unstable group) to make it insoluble, and the block is then dissociated with the light acid generator to recover the solubility of the polymer. Examples of the acid-to-unstable group (the R group of —OR) which can block the hydroxyl group (the —OH group) include a t-butoxycarbonyl group (referred as "t-BOC" group), a t-butoxy group, a t-butoxycarbonylmethyl group, a tetrahydropyranyl group, a trimethylsilyl group and an iso-propoxycarbonyl group. No particular restriction is put on the resin having the hydroxyl group, so long as it can exert the above-mentioned effect, but it is usually a resin having a phenolic hydroxyl group. As the acid-to-unstable group, the t-BOC group and the t-butoxy group are preferable, and examples of the resin having this acid-to-unstable group include poly(t-butoxycarbonyloxy-styrene), poly(t-butoxycarbonyloxy-α-styrene), poly(t-butoxystyrene), and copolymers of these monomers and other polymerizable monomers {e.g., $C_{1-24}$ alkyl or cycloalkyl esters, maleimide and sulfones of methyl(meth) acrylic acid}. The composition of the poly(t-butoxycarbonyloxystyrene) having the t-BOC group utilizes, for example, characteristics that the t-BOC group decomposes with the acid generated from the light acid generator to evaporate isobutene and a carbon dioxide gas, so that the polymer becomes a polystyrene and the t-BOC group changes into a hydroxyl group, whereby the polarity of the resin changes (increases) and its solubility in the developing solution (the aqueous alkali solution) improves. In addition, examples of the resin having the acid-to-unstable group (the R' group of —COOR') which can block the carboxyl group (the —COOH group) include carboxylic acid ester derivatives having a t-butyl group.

Moreover, the composition can be used as a binary component system of the resin having the acid-to-unstable group and the light acid generator, or a ternary component system of the resin having the acid-to-unstable group, the light acid generator and another resin. The employment of the another resin permits, for example, the improvement of a coating operativity of the composition and the change of the solubility in the developing solution.

The above-mentioned composition (3) is a liquid or a solid resin composition comprising (a) a resin having a carboxyl group and/or a hydroxyphenyl group, (b) an ether bond-including olefinic unsaturated compound, and the light acid generator for generating the acid group by the irradiation of the light.

In the case of the resin (a) having both of the carboxyl group and the hydroxyphenyl group, there can be used a resin having these groups in one molecule, or a mixture of resins differently having these groups.

Examples of a carboxyl group-containing resin (a-1) include acrylic resins and polyester resins.

The above-mentioned resin (a-1) preferably has a number-average molecular weight of about 500 to 100,000, more particularly about 1,500 to 30,000, and the amount of the carboxyl group is preferably about 0.5 to 10 mols, more preferably about 0.7 to 5 mols per kg of the resin.

Examples of a hydroxyphenyl group-containing resin (a-2) include a condensate of a monofunctional or a polyfunctional phenol compound, an alkylphenol compound or a mixture thereof and a carbonyl compound such as formaldehyde or acetone; and a copolymer of a hydroxyphenyl group-containing unsaturated monomer such as p-hydroxystyrene and the above-mentioned other polymerizable unsaturated monomer which can be used as needed.

The above-mentioned resin (a-2) preferably has a number-average molecular weight of about 500 to 100,000, more particularly about 1,500 to 30,000, and the amount of the hydroxyphenyl group is preferably about 1.0 mol or more, more preferably about 2 to 8 mols per kg of the resin.

Furthermore, in the case that a mixture of resin (a-1) and resin (a-2) is used, a mixing ratio of resin (a-1)/resin (a-2) is preferably within the weight ratio range of 90/10 to 10/90.

Examples of a resin (a-3) having a carboxyl group and a hydroxyphenyl group include a copolymer of a carboxyl group-containing polymerizable unsaturated monomer {(meth)-acrylic acid or the like} and a hydroxylphenyl group-containing polymerizable unsaturated monomer (hydroxystyrene or the like) and, if necessary, another polymerizable unsaturated monomer {an alkyl ester having 1 to 12 carbon atoms of acrylic acid such as methyl (meth)acrylate, ethyl (meth)acrylate, propyl (meth)acrylate, butyl (meth)acrylate or 2-ethylhexyl (meth)acrylate, an aromatic compound such as styrene, or a nitrogen-including unsaturated monomer such as (meth)acrylonitrile}; and a phenol resin obtained by reacting a hydroxybenzoic acid, gallic acid, resorcinic acid, or a mixture of any of them and phenol, a naphthol, resorcin or catechol with formaldehyde.

The above-mentioned resin (a-3) preferably has a number-average molecular weight of about 500 to 100,000, more particularly about 1,500 to 30,000, and the amount of the carboxyl group is preferably about 0.5 to 10 mol, more preferably about 0.7 to 5 mols per kg of the resin. The amount of the hydroxyphenyl group is preferably about 1.0 mol or more, more preferably about 2 to 8 mols per kg of the resin.

The ether bond-including olefinic unsaturated compound (b) is a compound having about 1 to 4 of unsaturated ether groups such as vinyl ether group, 1-propenyl ether group and 1-butenyl ether group at molecular terminals. Compound (b) is a low-molecular weight or a high-molecular weight compound having, in one molecule, at least one, preferably 2 to 4 of unsaturated ether groups represented by the formula —R"O—A wherein A is an olefinic unsaturated group such as vinyl group, 1-propenyl group or. 1-butenyl; and R" is a straight-chain or a branched alkylene group having 1 to 6 carbon atoms such as ethylene, propylene or butylene. Typical examples of compound (b) include a condensate of a polyphenol compound such as bisphenol A, bisphenol F, bisphenol S or a phenol resin, or a polyol such as ethylene glycol, propylene glycol, tri-methylolpropane, triethylolethane or pentaerythritol, and a halogenated alkyl unsaturated ether such as chloroethyl vinyl ether; and a reaction product of a polyisocyanate compound such as tolylene diisocyanate, xylylene diisocyanate, hexamethylene diisocyanate or isophorone diisocyanate, and a hydroxyalkyl unsaturated ether such as hydroxyethyl vinyl ether. In particular, the condensate of the polyphenol compound and the halogenated alkyl unsaturated ether, and the reaction product of a polyisocyanate compound having an aromatic ring and the hydroxyalkyl unsaturated ether are desirable from the viewpoints of etching resistance and the precision of a formed pattern.

The amount of compound (b) to be used is usually in the range of about 5 to 150 parts by weight, preferably about 10 to 100 parts by weight with respect to 100 parts by weight of resin (a).

The composition including components (a) and (b) is a positive type photosensitive resin composition in which a film formed from this composition is crosslinked by an addition reaction of the carboxyl group and/or the hydroxyphenyl group and the unsaturated ether group when heated, whereby the film becomes insoluble in a solvent or an aqueous alkali solution, and when the film is irradiated with an active energy ray and then heated, the crosslinking structure is cut by the catalytic function of a generated acid, so that an exposed portion becomes soluble again in the solvent or the aqueous alkali solution.

In the composition, an acid hydrolytic reaction occurs in an exposed portion of the formed film by the acid generated when the formed film is exposed, but in order to smoothly advance this acid hydrolytic reaction, it is preferred that water is present in the reaction system. Thus, by introducing a hydrophilic resin such as polyethylene glycol, polypropylene glycol, methyl cellulose or ethyl cellulose into the composition of the present invention, water necessary for the above-mentioned reaction can be incorporated into the formed film. The amount of the hydrophilic resin to be added is preferably 20 parts by weight or less, more preferably in the range of 0.1 to 10 parts by weight with respect to 100 parts by weight of the resin component.

Furthermore, the light acid generator mentioned in the above-mentioned (2) and (3) is a compound capable of generating the acid when exposed, and the resin can be decomposed by using the thus generated acid as a catalyst. As the light acid generator, a conventional known compound can be used. Typical usable examples of this light acid generator include onium salts such as sulfonium salts, ammonium salts, phosphonium salts, iodonium salts and selenium salts, iron-arene complexes, silanol-metal chelate complexes, triazine compounds, diazidonaphthoquinone compounds, sulfonic acid esters, sulfonic acid imide esters and halogen compounds. In addition to the above-mentioned compounds, it is also possible to use the light acid generators mentioned in Japanese Patent Application Laid-Open No. 146552/1995 and Japanese Patent Application No. 289218/1997. This light acid generator component may be a mixture with the above-mentioned resin or may be bonded to the resin. A blend ratio of the light acid generator is preferably in the range of 0.1 to 40 parts by weight, more preferably 0.2 to 20 parts by weight with respect to 100 parts by weight of the resin.

Furthermore, if necessary, a photosensitizing dye may be blended with the composition, so long as it is not affected by the safelight. Examples of the photosensitizing dye include the dyes of phenothiazines, anthracenes, coronenes, benzanthracenes, perylenes, merocyanines, ketocoumarins, fumarins, borates and the like. Examples of the usable borate photosensitizing dyes include dyes mentioned in Japanese Patent Application Laid-Open Nos. 241338/1993, 5685/1995 and 225474/1995.

A blend ratio of the photosensitizing dye is preferably in the range of about 0.1 to 10 parts by weight, more preferably 0.3 to 5 parts by weight with respect to 100 parts by weight of resin (a).

If necessary, the composition of the present invention can be blended with the above-mentioned other resin which can increase or conversely decrease its solubility in the organic solvent or the aqueous developing solution and which is soluble (or insoluble) in water or the organic solvent. Typical examples of such a resin include phenol resins, polyester resins, acrylic resins, vinyl resins, vinyl acetate resins, epoxy resins, silicone resins, fluorinated resins, mixtures of two or more thereof, and modifications thereof.

Additionally, in order to impart a suitable flexibility, non-adhesiveness or the like to the film formed from the composition of the present invention, a plasticizer such as a phthalic ester, a polyester resin, an acrylic resin or the like can be added to the composition of the present invention.

If necessary, it is also possible to add a fluidity modifier, a plasticizer or a colorant such as a dye or a pigment to the composition of the present invention.

The positive type photosensitive resin composition of the present invention can be used for a variety of applications as known usual photosensitive materials such as coating compositions, inks, adhesives, resist materials, printing plate materials (printing materials for planography and letterpress, and presensitized plates for offset lithography), information recording materials, and materials for relief images.

The dry thickness (exclusive of the solvent) of the film formed from the positive type photosensitive resin composition of the present invention is set so that the absorbency of the unsensitized coating film formed from this composition may be 0.5 or less in the range of the maximum wavelength ±30 nm selected in the maximum wavelength range of the safelight, but from a practical viewpoint, it is usually in the range of 0.5 to 50 μm, preferably 1 to 30 μm. Furthermore, the absorbency depends on kinds and amounts of the light acid generator, the photosensitizer and the like contained in the composition, and even in the case of the same composition, it also depends on the thickness of the formed coating film. That is to say, in the same composition, when the thickness of the film increases, the concentrations of the light acid generator, the photosensitizer and the like contained in the film increase, so that the absorbency increases. On the other hand, when the thickness of the film decreases, the concentrations of the above-mentioned components contained in the film decrease, so that the absorbency decreases. It is apparent from the foregoing that the absorbency can be adjusted so as to be within the above-mentioned range by adjusting the thickness of the formed film.

The positive type photosensitive resin composition of the present invention can be used as an organic solvent type photosensitive resin composition or an aqueous photosensitive resin-composition.

The above-mentioned organic solvent type photosensitive resin composition is an organic solvent type photosensitive resin composition obtained by dissolving or dispersing the positive type photosensitive resin composition in an organic solvent (e.g., ketones, esters, ethers, cellosolves, aromatic hydrocarbons, alcohol or halogenated hydrocarbons). This composition is applied onto a substrate (e.g., a sheet made from metals such as aluminum, magnesium, copper, zinc, chromium, nickel and iron, an alloy thereof as a component, or a printed board, a plastic, a glass or a silicon wafer surface-treated with the above-mentioned metal or alloy, or carbon plate) by means of a roller, a roll coater, a spin coater, a curtain roll coater, a spray coating, electrostatic coating, immersion coating or silk screen printing, and if necessary, setting is carried out, followed by drying to obtain a photosensitive material (film).

The above-mentioned aqueous photosensitive resin composition can be obtained by dissolving or dispersing the positive type photosensitive resin composition in water. This kind of composition can be handled similarly to a usual photosensitive material for electrodeposition coating, and so it can be used as a coating composition for the electrodeposition coating. The aqueous dispersion or the aqueous solution of the aqueous photosensitive resin composition can be formed by neutralizing the composition with an alkali (a neutralizer) when an anionic group such as a carboxyl group is introduced in the positive type photosensitive resin composition, or neutralizing it with an acid (a neutralizer) when a cationic group such as an amino group is introduced therein.

Usable examples of the above-mentioned alkali neutralizer include monoethanolamine, diethanolamine, triethylamine, diethylamine, dimethylaminoethanol, cyclohexylamine and ammonia. In addition, usable examples of the acid neutralizer include acetic acid, propionic acid, lactic acid, hydrochloric acid, sulfuric acid, phosphoric acid, formic acid and crotonic acid. The amount of the neutralizer to be used is usually in the range of 0.2 to 1.0 equivalent, preferably 0.3 to 0.8 equivalent per equivalent of the ionic group contained in the photosensitive resin composition.

The above resin containing the ionic group is such that a carboxyl group is preferably in the range of about 30 to 700 mg KOH/g, more preferably 40 to 600 mg KOH/g in terms of an acid value of the resin. If the acid value is less than about 30 mg KOH/g, the removal of the uncured film by the treatment with a developing solution is poor, and inconveniently, copper cannot be sufficiently removed in the next etching step on occasion. On the other hand, when the acid value is more than about 700 mg KOH/g, a resist film portion (a cured film portion) is easily separated, so that a satisfactory copper circuit cannot be formed inconveniently. Moreover, the amino group is such that an amine value is preferably in the range of about 20 to 650, more preferably about 30 to 600. If the amine value is less than about 20, copper cannot sufficiently be removed in the etching step sometimes as described above, and on the other hand, if the amine value is more than about 650, the resist film is easily removed inconveniently sometimes.

As the electrodeposition coating composition, there can be used, for example, a cationic electrodeposition coating composition having a pH of 4 to 7 or an anionic electrodeposition coating composition having a pH of 7 to 9 in which a bath concentration (a solid content concentration) is adjusted to the range of 3 to 25% by weight, preferably 5 to 15% by weight.

The electrodeposition coating composition can be applied onto the surface of a conductor, which is a material to be coated, in the following manner. That is to say, the pH and the concentration of the bath are first adjusted to be within the above-mentioned ranges, and the bath temperature is then controlled so as to be in the range of 15 to 40° C., preferably 15 to 30° C. Next, a DC voltage of 5 to 200 V is applied to the thus controlled electrodeposition bath, while the conductor to be coated is immersed in the bath as an anode when the electrodeposition coating composition is an anionic type, or as a cathode when the electrodeposition coating composition is a cationic type. A voltage application time is suitably in the range of 10 seconds to 5 minutes. The thickness of the obtained coating film is usually in the rage of 0.5 to 50 μm, preferably 1 to 15 μm in terms of the dry coating film thickness.

After the electrodeposition coating, the applied substrate is taken out of the electrodeposition bath, washed with water, and then dried with hot air to remove water content from the electrodeposited coating film. Examples of the usable conductor include conductive materials such as metals, carbon and tin oxides as well as plastics and glasses whose surfaces are fixedly covered with these conductive materials by lamination, plating or the like.

In addition to the above-mentioned use applications, for example, the positive type photosensitive resin composition of the present invention can be applied onto a transparent resin film of a polyester resin such as polyethylene terephthalate, an acrylic resin, a polyethylene, a polyvinyl chloride resin or the like which becomes a base film layer by the use of-a roll coater, a blade coater or a curtain coater, followed by drying to form a resist film (the dry film thickness=about 0.5 to 5 μm). Afterward, a protective film is then laminated on this coating film to obtain a dry film resist.

From such a dry film resist, the protective film can be peeled off, and the dry film resist can be then laminated on a support so that the dry film resist may come in contact with the support by a means such as thermocom-pression bonding, thereby forming the resist film on the support. After the base film is peeled off or without the peeling, the resist film can be exposed to the visible light and then sensitized in accordance with an image in the same manner as in the case of the above-mentioned electrodeposition coating. When the base film is present, this base film is peeled off, and when it is not present, a developing treatment can be directly carried out, thereby forming the image.

As for a light source of activation energy rays for sensitizing the positive type photosensitive resin composition of the present invention, conventional known activation energy rays can be used without any particular restriction, so long as they can irradiate the activation energy rays necessary to sensitize the composition which is not sensitized by the safelight. Examples of the light source which can emit the visible light include an ultra-high pressure, a high pressure, an intermediate pressure or a low pressure mercury-vapor lamp, a chemical lamp, a carbon-arc lamp, a xenon lamp, a metal halide lamp and a tungsten lamp. Moreover, there can also be used various lasers having an oscillation line in the visible light range in which an ultraviolet light is cut from the above-mentioned light sources through an ultraviolet light cut filter. Above all, the laser having the oscillation line in the visible light range such as an argon laser (488 nm) or a YAG-SHG laser (532 nm) is preferable.

The positive type photosensitive resin composition of the present invention can be applied or printed on a substrate such as a plastic sheet, a metal, a glass, a paper or a lumber without any decomposition of the composition under the bright irradiation circumstance conditions of the stipulated safelight. In addition, the composition is preferably used as the positive type photosensitive resin composition for the formation of the resist pattern coating film.

Next, a procedure of forming the resist pattern on the substrate by the use of this positive type photosensitive resin composition will be described as follows:

The positive type photosensitive resin composition is applied onto the substrate to form a photosensitive film thereon (Step 1), and the surface of the applied photosensitive film is exposed to a laser beam directly or a light through a mask film to sensitize the photosensitive film so that a desired resist film (an image) may be obtained on the surface of the photosensitive film (step 2). Next, an sensitized portion of the photosensitive film is then developed with an alkaline or an acidic aqueous solution to form a resist pattern on the substrate (Step 3). Furthermore, a copper layer portion, which is not protected by the resist film, is removed, and the resist film is further removed to obtain the desired resist pattern.

Examples of the above substrate include plastic films and plastic plates such as electrically insulating glass-epoxy plates, polyethylene terephthalate films and polyimide films; these plastic plates and plastic films on which a conductive film is formed by allowing a metal foil of copper or aluminum to adhere to the surface thereof, or by subjecting them to vacuum deposition, chemical deposition or plating by the use of a metal such as copper, nickel or silver, or a compound such as a conductive oxide typified by indium-tin oxide (ITO); plastic plates and plastic films provided with through-holes in which the surfaces and the through-holes are covered with a conductive film; and metallic plates such as copper plates.

In the above-mentioned application step (1), when the positive type photosensitive resin composition is an organic solvent system, this composition is applied onto the surface of the substrate by means of spray coating, electrostatic coating, spin coating, immersion coating, roller coating, curtain flow coating or silk screen printing, and if necessary, setting is carried out, followed by drying the substrate at a temperature in the range of about 50 to 130° C. to obtain the photosensitive resin film. The thus formed film is next exposed in step (2). Furthermore, when the positive type photosensitive resin composition is an electrodeposition coating composition, the composition is electrodeposited, drained, air-blown, and if necessary, dried at a temperature of about 50 to 130° C. to thereby form the positive type photosensitive resin film.

The thickness of the thus formed positive type photosensitive resin film is preferably in the range of about 0.5 to 500 μm, more preferably about 1 to 30 μm.

As a light beam for use in the exposure step (2), particularly a visible light in which the wavelength of an emission spectrum of the light source is 488 nm (argon laser) or 532 nm (YAG-SHG laser) has been put to practical use, and the employment of this kind of visible light is preferable, but it is not limited.

In the developing treatment (3), when an anionic group-containing resin is used in the positive type photosensitive resin composition, the sensitized film is washed out with, usually, a weak alkaline aqueous solution prepared by diluting caustic soda, sodium carbonate, caustic potash, ammonia or an amine with water. Furthermore, when a cationic group-containing resin is used in the positive type photosensitive resin composition, the sensitized film is washed out with, usually, a weak acidic aqueous solution prepared by diluting hydrochloric acid, sulfuric acid, phosphoric acid, acetic acid, silicic acid, formic acid or lactic acid with water.

At least one step of the above steps (1) to (3) should be carried out under the irradiation circumstance conditions of the safelight (preferably a sodium lamp) having a maximum wavelength in the range of 550 to 620 nm.

Furthermore, in the case that the above substrate is an etching resist substrate, an exposed copper layer (a non-circuit portion) can be next etched and removed with an aqueous solution of ferric chloride or cupric chloride. In addition, the resist film can be removed with a solvent, e.g., a strong alkali such as caustic soda or methylene chloride.

The thus obtained substrate on which the resist pattern is formed can be used for decoration, or as a solder resist substrate or an etching resist substrate.

The present invention will be described in more detail in accordance with examples. Incidentally, "part(s)" in the examples and comparative examples means "part(s) by weight".

EXAMPLE 1

A mixture of 200 parts of tetrahydrofuran, 65 parts of p-hydroxystyrene, 28 parts of n-butyl acrylate, 11 parts of acrylic acid and 3 parts of azobisisobutyronitrile was reacted at 100° C. for 2 hours, and the resultant reaction product was then poured into 1,500 cc of toluene solvent, whereby the reaction product was precipitated and separated. Afterward, the collected precipitate was dried at 60° C. to obtain a photosensitive resin having a molecular weight of about 5,200 and a hydroxyphenyl group content of 4.6 mols/kg. Next, 100 parts of this photosensitive resin were blended with 60 parts of a divinyl ether compound (a condensate of 1 mol of a bisphenol compound and 2 mols of 2-chloroethyl vinyl ether), 10 parts of NAI-105 (trade name, made by Midori Chemical Co., Ltd.; a light acid generator) and 1.5 parts of NKX-1595 (trade name, made by Nippon Photosensitive Dye Co., Ltd. (Nippon Kanko-Shikiso Kenkyujo. K.K.); photosensitizing dye of coumarin dyes), and the blend was then dissolved in diethylene glycol dimethyl ether so that a solid content might be 20%, thereby obtaining a photosensitive solution.

This photosensitive solution was applied onto a copper plated and glass fiber reinforced epoxy substrate in a dark room by a bar coater so that a dry film thickness might be 5 μm, followed by drying at 120° C. for 8 minutes to form a resist film, thereby preparing the substrate having the resist film thereon.

Next, the surface of the substrate having the resist film obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resist film was smoothly sensitized. It was confirmed that the sensitized portion of the resist film was dissolved in the 1% aqueous sodium carbonate solution. Also by the irradiation with a xenon lamp and second harmonic (532 nm) of a YAG-SHG laser, the similar results could be obtained.

Figure 4:
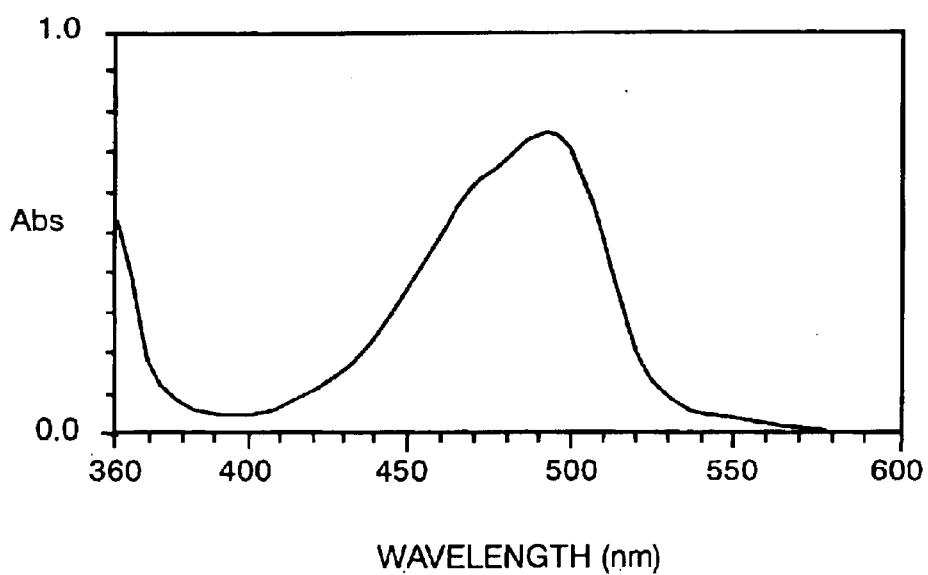
FIG. 4 is a graph showing an absorbancy curve of an unexposed film used in Example 1.

The above-mentioned photosensitive solution was applied onto a transparent polyethylene terephthalate sheet by the bar coater so that a film thickness might be 5 μm, followed by drying at 60° C. for 10 minutes, and an absorbency of the resultant film was then measured. The results are shown in FIG. 4. In this drawing, the ordinate axis and the abscissa axis denote the absorbency and a wavelength nm, respectively. In FIG. 4, the absorbency of the film in the wavelength of 600 nm or more on the abscissa axis was 0.00.

On an absorbency curve in FIG. 4 and in the range of 559 nm to 619 nm present in the range of a maximum wavelength 589 nm±30 nm in FIG. 1, the absorbency of the film is 0.0 or less, and it is apparent that the safelight does not have a bad influence on the photosensitive solution.

EXAMPLE 2

A mixture of 22 parts of acrylic acid, 50 parts of styrene, 28 parts of n-butyl methacrylate and 5 parts of azobisisobutyronitrile (AIBN) was added dropwise over 2 hours to 60 parts of methyl isobutyl ketone which was being heated at 80° C. and stirred, and this temperature was further maintained for 2 hours to obtain a polymer having a solid content of about 62.5% and a carboxyl group content of 3 mols/kg.

A mixture of 80 parts of the thus obtained carboxyl group-including polymer (solid content=62.5%), 20 parts of p-hydroxystyrene polymer (molecular weight=1000), 60 parts of a divinyl ether compound (a condensate of 1 mol of a bisphenol compound and 2 mols of 2-chloroethyl vinyl ether), 2 parts of polyethylene glycol (average molecular weight=400), 10 parts of NAI-105 (trade name, made by Midori Chemical Co., Ltd.; a light acid generator) and 1.5 parts of the same photosensitizer as used in Example 1 was dissolved in diethylene glycol dimethyl ether, thereby obtaining a 20% by weight photosensitive solution.

This photosensitive solution was applied onto a copper plated and glass fiber reinforced epoxy substrate in a dark room by a bar coater so that a dry film thickness might be 5 μm, followed by drying at 120° C. for 8 minutes to prepare the substrate having a resist film thereon.

Next, the surface of the substrate having the resist film (dry film thickness=5 μm) obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resist film was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 3

A mixture of 100 parts of p-hydroxystyrene polymer (molecular weight=1,000), 60 parts of a divinyl ether compound (a condensate of 1 mol of a bisphenol compound and 2 mols of 2-chloroethyl vinyl ether), 2 parts of polyethylene glycol (average molecular weight=400), 10 parts of NAI-105 (trade name, made by Midori Chemical Co., Ltd.; a light acid generator) and 1.5 parts of the same photosensitizer as used in Example 1 was dissolved in diethylene glycol dimethyl ether, thereby obtaining a 20% by weight photosensitive solution.

This photosensitive solution was applied onto a copper plated and glass fiber reinforced epoxy substrate in a dark room by a bar coater so that a dry film thickness might be 5 μm, followed by drying at 120° C. for 8 minutes to prepare the substrate having a resist film thereon.

Next, the surface of the substrate having the resist film (dry film thickness=5 μm) obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resist film was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 4

100 parts (solid content) of the photosensitive solution obtained in Example 1 were mixed with triethylamine in an amount of 0.8 equivalent with respect to a carboxyl group, and after stirring, the mixture was then dispersed in deionized water to obtain an aqueous resin dispersion (solid content=15%).

Anionic electrodeposition coating was carried out so that the thickness of a dry film might be 5 μm under conditions that the thus obtained aqueous resin dispersion was used as an electrodeposition coating bath and a laminated copper plate was used as an anode. Afterward, the plate having the film was washed with water, and then heated at 120° C. for 8 minutes to obtain a substrate having a resist film thereon.

Next, the surface of the substrate having the resist film (dry film thickness=5 μm) obtained above was irradiated with a sodium lamp shown in FIG. 1 for 24 hours so that an illuminance intensity might be 40 lux. Next, this substrate was heated at 80° C. for 10 minutes in a dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resist film was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 5

A mixture of 200 parts of tetrahydrofuran, 65 parts of p-hydroxystyrene, 18 parts of dimethylaminoethyl methacrylate, 17 parts of n-butyl acrylate and 3 parts of azobisisobutyronitrile was reacted at 100° C. for 2 hours, and the resultant reaction product was then poured into 1,500 cc of toluene solvent, whereby the reaction product was precipitated and separated. Afterward, the collected precipitate was dried at 60° C. to obtain a photosensitive resin having a molecular weight of about 5,000 and a hydroxyphenyl group content of 4.6 mols/kg. Next, 100 parts of this photosensitive resin were blended with 60 parts of a divinyl ether compound (a condensate of 1 mol of a bisphenol compound and 2 mols of 2-chloroethyl vinyl ether), 10 parts of NAI-105 (trade name, made by Midori Chemical Co., Ltd.; a light acid generator) and 1.5 parts of the same photosensitizer as used in Example 1, and the blend was then dissolved in diethylene glycol dimethyl ether so that a solid content might be 60%, thereby obtaining a photosensitive solution.

100 parts (solid content) of the photosensitive solution obtained above were mixed with acetic acid in an amount of 0.8 equivalent with respect to an amino group, and after stirring, the mixture was then dispersed in deionized water to obtain an aqueous resin dispersion (solid content=15%).

Cationic electrodeposition coating was carried out so that the thickness of a dry film might be 5 μm under conditions that the thus obtained aqueous resin dispersion was used as an electrodeposition coating bath and a laminated copper plate was used as an cathode. Afterward, the plate having the film was washed with water, and then heated at 120° C. for 8 minutes to obtain a substrate having a resist film thereon.

Next, the surface of the substrate having the resist film (dry film thickness=5 μm) obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resist film was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 6

1000 parts of tetrahydrofuran were blended with 50 parts of poly(t-butoxycarbonyloxystyrene)(molecular weight= 1000), 50 parts of the undermentioned novolak phenol resin, 10 parts of NAI-105 (trade name, made by Midori Chemical Co., Ltd.; a light acid generator) and 1.5 parts of the same photosensitizing dye as used in Example 1 to obtain a photosensitive solution having a solid content of 9%.

Preparation of the Novolak Phenol Resin

In flask, 1,490 parts of o-cresol, 1,145 parts of 30% formalin, 130 parts of deionized water and 6.5 parts of hydrochloric acid were placed, and the mixture was then heated under reflux for 60 minutes. Next, 13.5 parts of 15% hydrochloric acid were added thereto, followed by heating under reflux for 40 minutes. Afterward, 400 parts of deionized water at about 15° C. were added thereto, and the temperature of the contents was then maintained at about 75° C. to precipitate a resin. Next, a 35% aqueous sodium hydroxide solution was added, and after neutralization, the resultant aqueous layer was removed. The resin was washed with 400 parts of deionized water added thereto at 75° C. Afterward, the resultant aqueous layer was removed, and a similar washing operation was further repeated twice. The resin was then dried at about 120° C. under reduced pressure to obtain the desired novolak phenol resin having a molecular weight of 600.

The photosensitive solution obtained above was applied onto a substrate so that a dry film thickness might be 5 μm, and it was then heated at 120° C. for 8 minutes to prepare the substrate having a resist film thereon.

Next, the surface of the substrate having the resist film (dry film thickness 5 μm) obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resin was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 7

To 1,000 parts of tetrahydrofuran, 50 parts of poly (tetrahydropyranyl ether styrene)(molecular weight=1000), 50 parts of the same novolak phenol resin as in Example 6, 10 parts of NAI-105 (trade name, made by Midori Chemical Co., Ltd.; a light acid generator) and 1.5 parts of the same photosensitizing dye as used in Example 1 were blended, so that a photosensitive solution having a solid content of 9% was obtained.

This photosensitive solution was applied onto a substrate so that a dry film thickness might be 5 μm, and the film was washed with water, and then heated at 120° C. for 8 minutes to prepare a substrate having a resist film thereon.

Next, the surface of the substrate having the resist film (dry film thickness=5 μm) obtained above was irradiated with a sodium lamp shown in FIG. 1 for 24 hours so that an illuminance intensity might be 40 lux. Afterward, this substrate was heated at 80° C. for 10 minutes in the dark room, and then immersed at 30° C. for 1 minute in a 1% aqueous sodium carbonate solution as a developing solution. As a result, the resist film was not dissolved in the aqueous sodium carbonate solution, which conveniently meant that any bad influence by the irradiation of the sodium lamp was not present.

Moreover, the substrate having the resist film was irradiated with an argon laser having an intensity of 2 mJ/m$^2$, and at this time, the resin was rapidly sensitized. It was confirmed that the resist film was dissolved in the 1% aqueous sodium carbonate solution. Also by the irradiation with a xenon lamp and second harmonic (532 nm) of a YAG-SHG laser, the similar results could be obtained.

EXAMPLE 8

A substrate having a resist film thereon was prepared by the same procedure as in Example 1 except that a sodium lamp shown in FIG. 1 was replaced with a sodium lamp in FIG. 2. Furthermore, the obtained substrate was immersed in a 1% aqueous sodium carbonate solution in the same manner as in Example 1. As a result, the resist film was not dissolved in the aqueous sodium carbonate solution, which conveniently meant that any bad influence by the irradiation of the sodium lamp was not present.

COMPARATIVE EXAMPLES 1 to 7

Substrates having resist films (which would not be cured with YAG or the like) thereon were prepared by the same procedure as in Examples 1 to 7 except that a sodium lamp was replaced with a fluorescent lamp as a safelight (Comparative Examples 1 to 7 corresponds to Examples 1 to 7, respectively). The obtained substrates were immersed in a developing solution of a 1% aqueous sodium carbonate solution (Comparative Examples 1 to 4, 6 and 7) or a 2.38% aqueous tetramethylammonium hydroxide solution (Comparative Example 5) in the same manner as in Example 1. As a result, all resist films were partially dissolved in the developing solutions. That is to say, these resist films were sensitized by the irradiation light from the fluorescent lamp, and as a result, desired resist pattern could not be formed after exposing and developing steps.

FIG. 5 is a graph showing a spectral distribution of the fluorescent lamp used in Comparative Examples 1 to 7.

What is claimed is:
1. A method for forming a resist pattern which comprises:
   (1) a step of applying a positive type photosensitive resin composition onto a substrate to form a photosensitive film thereon,
   (2) a step of exposing the photosensitive film formed on the substrate to a laser beam having an oscillation line at 488 nm or 532 nm directly or through a mask film so that a desired resist pattern (an image) may be obtained on the photosensitive film, and
   (3) a step of subjecting the resist film to a developing treatment to form the resist pattern on the substrate, wherein absorbancy of an unexposed film formed from the positive type photosensitive resin composition is 0.5 or less within the range of a maximum wavelength ±30 nm selected in the range of the maximum wavelength of a safelight; and at least one step of the steps (1) to (3) is carried out under the irradiation circumstance of the safelight given from a discharge lamp containing sodium as a main component (which consists mainly of a D-ray having a light wavelength of 589 nm).

* * * * *

UNITED STATES PATENT AND TRADEMARK OFFICE
CERTIFICATE OF CORRECTION

PATENT NO. : 6,699,646 B2
DATED : March 2, 2004
INVENTOR(S) : Genji Imai et al.

It is certified that error appears in the above-identified patent and that said Letters Patent is hereby corrected as shown below:

<u>Title page,</u>
Item [73], Assignee, insert the following:
-- Kansai Paint Co., Ltd., Japan --

Signed and Sealed this

Twenty-sixth Day of October, 2004

JON W. DUDAS
*Director of the United States Patent and Trademark Office*